(12) United States Patent
Van Camp et al.

(10) Patent No.: US 8,164,869 B2
(45) Date of Patent: Apr. 24, 2012

(54) DIODE CHAIN WITH A GUARD-BAND

(75) Inventors: Benjamin Van Camp, Antwerp (BE); Geert Wybo, Ghent (BE); Stefaan Verleye, Beernem (BE)

(73) Assignee: Sofics BVBA, Gistel (BE)

( * ) Notice: Subject to any disclaimer, the term of this patent is extended or adjusted under 35 U.S.C. 154(b) by 153 days.

(21) Appl. No.: 12/188,376

(22) Filed: Aug. 8, 2008

(65) Prior Publication Data
US 2009/0040670 A1 Feb. 12, 2009

Related U.S. Application Data

(60) Provisional application No. 60/954,655, filed on Aug. 8, 2007.

(51) Int. Cl.
*H02H 3/22* (2006.01)
(52) U.S. Cl. .......................................... 361/56; 361/111
(58) Field of Classification Search ................... 361/56, 361/111; 257/355–360
See application file for complete search history.

(56) References Cited

U.S. PATENT DOCUMENTS

| | | | | |
|---|---|---|---|---|
| 5,617,283 A * | 4/1997 | Krakauer et al. | ............... | 361/56 |
| 5,895,940 A * | 4/1999 | Kim | .............................. | 257/173 |
| 5,986,863 A * | 11/1999 | Oh | .................. | 361/56 |
| 6,965,504 B2 * | 11/2005 | Liu et al. | ........................ | 361/58 |
| 7,179,691 B1 * | 2/2007 | Lee et al. | ....................... | 438/135 |
| 7,187,527 B2 * | 3/2007 | Su et al. | .......................... | 361/56 |
| 7,285,827 B1 | 10/2007 | He et al. | | |
| 2004/0212936 A1 * | 10/2004 | Salling et al. | .................... | 361/56 |
| 2005/0280091 A1 * | 12/2005 | Huang et al. | ................... | 257/355 |
| 2006/0226499 A1 * | 10/2006 | Shimizu | ........................ | 257/409 |
| 2007/0045743 A1 * | 3/2007 | Tseng | ............................ | 257/355 |
| 2008/0073721 A1 * | 3/2008 | Fuchigami | ...................... | 257/355 |

* cited by examiner

*Primary Examiner* — Danny Nguyen
(74) *Attorney, Agent, or Firm* — Volpe and Koenig, P.C.

(57) ABSTRACT

The present invention provides an ESD protection device having at least one diode in a well of a first conductivity type formed in a substrate of a second conductivity type. The circuit further includes a guard-band of the first conductivity surrounding at least a portion of the diode, thus forming an NPN transistor between the diode cathode, the substrate and the guard-band.

25 Claims, 6 Drawing Sheets

US 8,164,869 B2

DIODE CHAIN WITH A GUARD-BAND

CROSS-REFERENCES

This application claims the benefit of U.S. Provisional Application Ser. No. 60/954,655 filed Aug. 8, 2007, entitled, "Improved Diode Chain with N Guard-ring", the entire content of which is incorporated herein by reference.

FIELD OF THE INVENTION

The present invention relates to an Electro Static Discharge (ESD) protection circuit. More specifically, the present invention relates to an improved ESD circuit having a chain of diodes with a guard-band.

BACKGROUND OF THE INVENTION

During an ESD event, large currents can flow through an Integrated Circuit (IC), potentially causing damage it to the IC. To avoid this damage, ESD protection circuits are added. In many ESD protection circuits, a chain of diodes is used. However, during very fast ESD events, a voltage overshoot is associated with every diode. When placing N diodes in series, this total overshoot is very high during the ESD event, which creates latch-up (dead short circuit between Vdd and ground), thus degrading or damaging sensitive nodes (e.g. gate oxides) in the circuitry.

A well-known approach to prevent latch up is to surround the diode(s) with a guard-band, which is typically a heavily P-doped region. This will cause the current that is injected in the substrate to flow safely to the guard-band, which is generally connected to the ground. Thus, the guard-band isolates the diode from the outside circuitry. However, the P+guard-band causes the triggering of the diode, and/or the diode chain to slow down.

Thus, there is a need in the art for a solution to provide an improved ESD protection device, which prevents any damage to the circuitry and also provides for an improved fast triggering during the ESD event.

SUMMARY OF THE INVENTION

The embodiments of the present invention provides an ESD protection device comprising at least one diode in a first well of first conductivity type formed on a second well of a second conductivity type. The device further comprises a guard-band of the first conductivity type surrounding at least a portion of said at least one diode.

In one embodiment of the present invention, the first conductivity type comprises an N-type doping region and the second conductivity type comprises a P-type doping region.

In another embodiment of the present invention, the first conductivity type comprises a P-type doping region and the second conductivity type comprises an N-type doping region.

DETAILED DESCRIPTION OF THE INVENTION

The present invention provides an ESD protection device having a diode chain, which is further optimized for fast triggering. According to the embodiments of the present invention, this is achieved by replacing the P+ guard-band around the diodes by an N-type guard-band to form an NPN transistor. The NPN transistor is a faster device compared to the PNP transistor. This is due to the fact that the conduction of the PNP is controlled by holes and the conduction of the NPN by electrons. Since the mobility of electrons is larger than the mobility of holes, the NPN structure will trigger faster than the PNP structure.

Figure 1A:
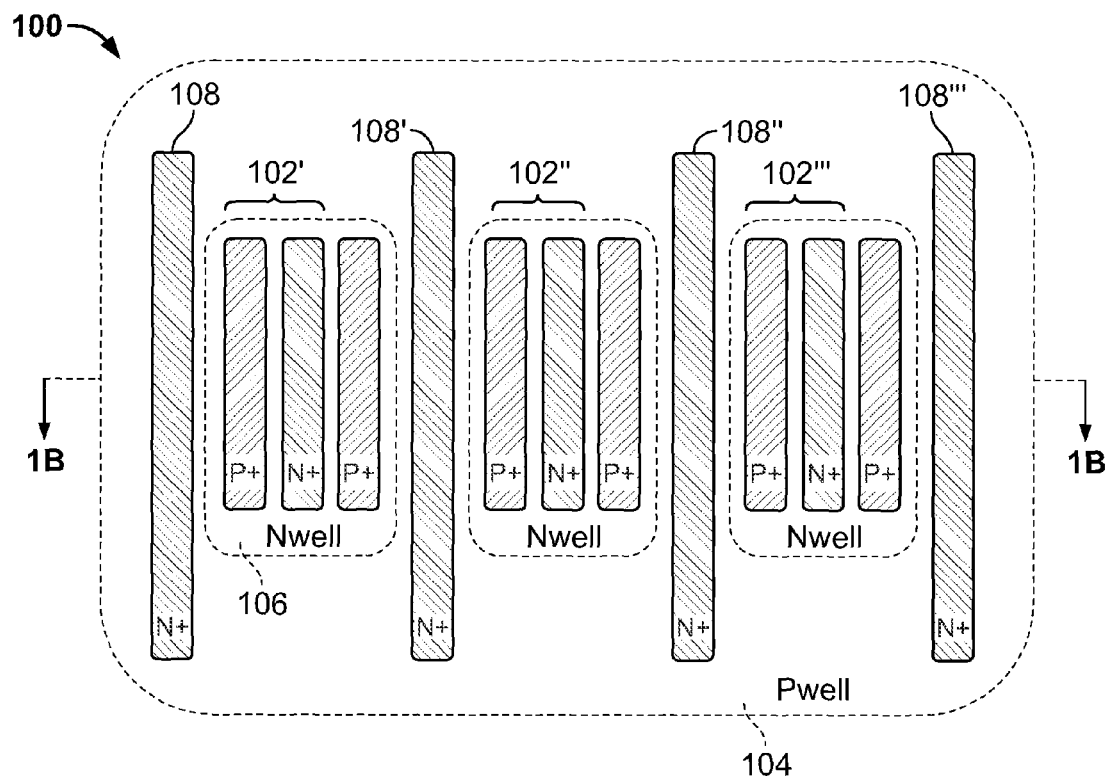
FIG. 1A illustrates a top view of an ESD device in accordance with a one embodiment of the present invention.
Figure 1B:
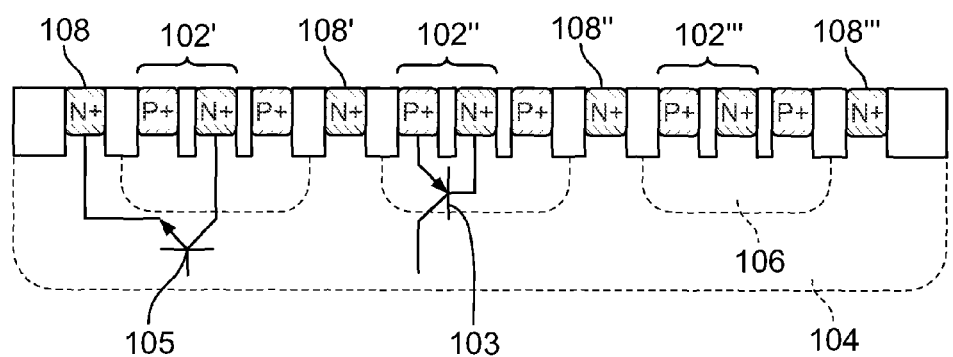
FIG. 1B illustrates a cross-section view along line 1B of the ESD device of FIG. 1A.

In one embodiment of the present invention, FIG. 1A illustrates a top view of an ESD protection device 100 and FIG. 1B illustrates a cross-section of the ESD device 100 taken along line 1B in FIG. 1A. The ESD device 100 includes a chain of three diodes 102 formed on a substrate 104 of a material of a first conductivity type, preferably a P type doping region (P-sub). Each of the diodes 102 contains an N doped and P doped region As shown in FIGS. 1A and 1B, a well 106 of a second conductivity type, preferably an N-type doping region (N-well) is formed in the P-sub 104. Both N-well 106 and P-sub 104 may include semi-conducting material, such as, for example, silicon, germanium or combinations of both. P-sub 104, as shown in FIG. 1A, may preferably be electrically grounded. Each of the PN diodes 102 also include a PNP 103 transistor formed by the PN junction of the diode 102 and the P-sub 104 as second P junction as illustrated in FIG. 1B. Even though in this embodiment of the present invention, the first conductivity type is defined as a P-type doping region and the second conductivity type is defined as an N-type doping region, one skilled in the art would appreciate that the first conductivity type may be the N-type doping region and the second conductivity type may be the P-type doping region.

In order to reduce the leakage current, a guard-band structure is formed on the active area. Generally in the prior art, a heavily doped P+ region is formed as a guard-band on the active area. This is because the P+ region has the same doping type as the substrate, P-sub 104. This makes a low ohmic connection between the P+ and the substrate region. However, a high ohmic is needed for the guard-band to ground the substrate. Therefore, in the present invention, an N+ guard-band 108 is formed on each side of the diodes 102 as illustrated in FIGS. 1A and 1B. This in turn creates an NPN transistor 105 formed between a diode cathode (N+ in diode 102), P-sub 104 and the N+ guard-band 108. The PNP 103 will initiate a trigger mechanism by providing an ESD current to the NPN 105 to turn on the NPN 105, which in turn will also flow current back to the PNP 103. In this manner, both the PNP 103 and the NPN 105 function together to initiate a fast triggering of the diodes during an ESD event. So, by changing the guard-band type to N+, the PNP 103 is strengthened by an NPN 105 and this combination of the two bipolar transistors 103 and 105 optimize the diode chain triggering behavior.

Additionally, although not shown, each of the N+ guard-bands 108 may be connected to ground or to a lower potential voltage. Alternatively, one or more of the N+ guard-bands 108 may be connected to ground and the rest of them may be connected to a lower potential voltage. The lower potential voltage as defined in this embodiment is any voltage lower than the voltage of the anode of the diode structure (P+ in 102). The lower potential voltage may include a voltage outside the ESD circuit 100 or the voltage one of the cathodes (N+ in 102) of the diode 102 in the ESD circuit 100. For example, in FIGS. 1A and 1B, the N+ guard-band 108 may be connected to ground or other lower potential outside the device 100, the N+ guard-band 108' may be connected to N+ of diode 102', the N+ guard-band 108" may be connected to N+ of diode 102" and the N+ guard-band 108'" may be connected to N+ of diode 102'".

Figure 2:
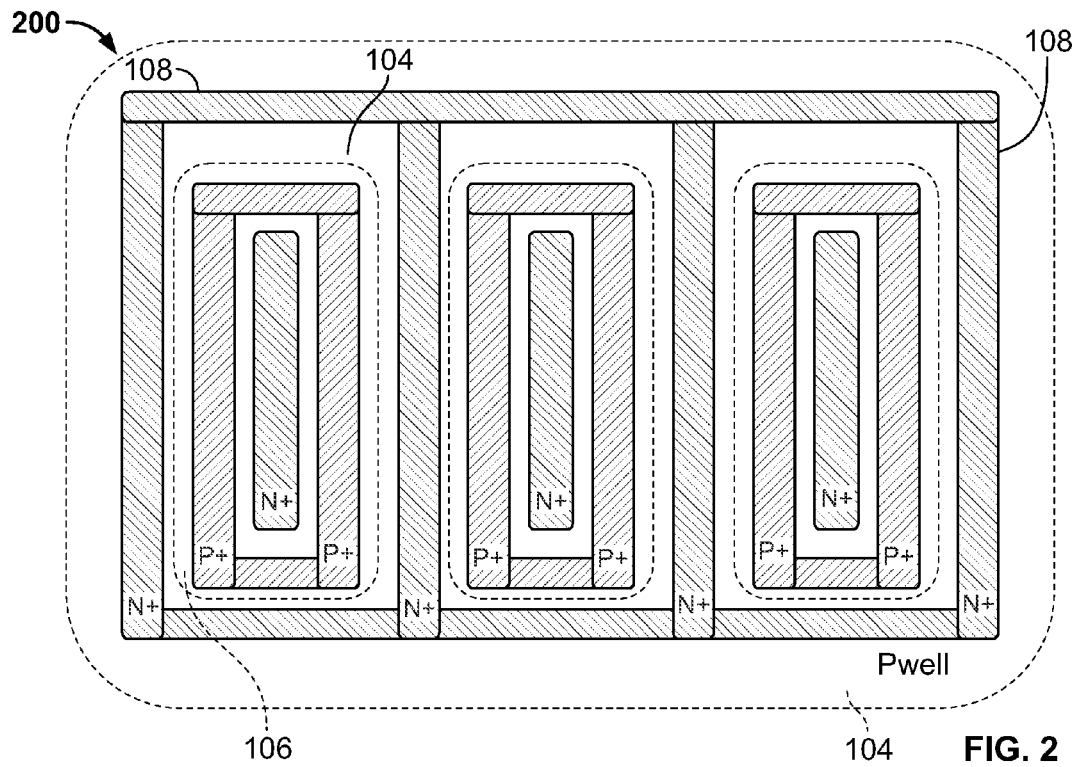
FIG. 2 illustrates a top view of an ESD device in accordance with an alternate embodiment with reference to FIG. 1A of the present invention.

In an alternate embodiment of the present invention, N+ guarding guard-band 108 is formed on all sides of each of the diodes 102 as illustrated in top view of an ESD device 200 of FIG. 2. In this embodiment, the top and bottom structure of the diodes 102 also include N+ guard-band 108, thus completely enclosing the diodes 102. This creates a larger perimeter/area for the N+ guard-band 108, which provides for an even stronger NPN 105 formed for each of the diodes 102 in the device, thus generating a stronger and faster diode chain triggering behavior. Furthermore, in this embodiment, the N+tap in the diode 102 is completely surrounded by a P+ tap. However, one skilled in the art would appreciate that this is only meant to illustrate a different diode layout and that the invention is not limited to any particular diode configuration.

Even though the diodes 102 illustrated in FIGS. 1 and 2 are Shallow Trench Isolation (STI) type diodes, it is obvious to one skilled in the art that the diodes 102 may include other types such as gated diode, NO-STI diodes, etc. Also, in both FIGS. 1 and 2, three diodes are illustrated to be placed in series, however, it is obvious to one skilled in the art that the invention is not limited to this number, and is applicable to any number of diodes. In fact, only one diode may preferably be implemented to function according to an alternate embodiment of the present invention.

Although, FIGS. 1 and 2 illustrate only two types of configurations of the guard-band, it is known to one skilled in the art that other types of configurations can also be formed.

Also, in both FIGS. 1 and 2, a guard-band 108 of N+ doping is used, however, one skilled in the art would understand that the invention is not limited to this doping type and other doping types may be used. One such example is to replace the P-substrate 106 with an N-substrate (not shown). In this example, N-well 106 will be replaced by P-well (not shown), each of the N+ guard-bands 108 will be replaced by P+ (not shown), P+ taps in each of the diodes 102 will be replaced by N+ taps (not shown) and the N+ tap in each of the diodes 102 will be replaced by P+ taps (not shown). In this example, an NPN transistor would be formed by the PN junction diode and the and the N-substrate. A PNP is added by the added P+ guard-band, the N-substrate and the P-well. Also, in this example, the P+ guard-band would be coupled to a higher potential voltage. The higher potential voltage in this example would be any voltage higher than the voltage of the cathode of the diode and, thus, the P+ guard-band would preferably be coupled to the anode of the diode.

Furthermore, in the embodiment illustrated in FIGS. 1 and 2, P+ taps of the diodes 102 are placed at the outside and the N+ tap is placed between the P+ taps, however, one skilled in the art knows the invention is not limited to this particular order and shape of placing the P+ and N+ taps of the diodes.

Figure 3A:
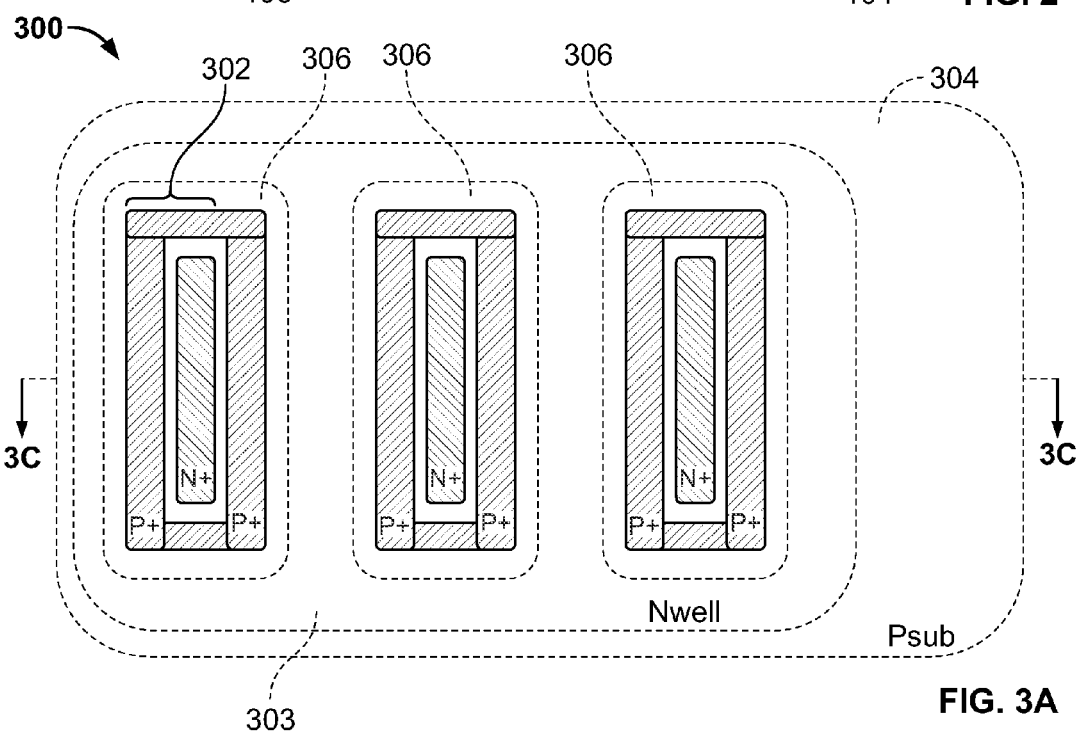
FIG. 3A illustrates a top view of an ESD device in accordance with another embodiment of the present invention.

The embodiments of FIGS. 1 and 2 of the present invention are shown only for N-well diodes. However, anyone skilled in the art can understand that a similar effect can be obtained for a chain of P-well diodes as shown in FIGS. 3A and 3C of the present invention. FIG. 3A illustrates a top view of an ESD device 300 in another embodiment of the present invention. FIG. 3C illustrates a cross-section view of an alternative ESD device. The ESD device 300 includes a chain of three P-well diodes 302 enclosed by an N-well 303 which are formed on a substrate of p-type material (P-sub) 104. Each of the diodes 102 contains an N doped and P doped region. In this embodiment, an isolated P-well, 306 is placed in the N-well 303 around the P-well diodes 302 as shown in FIGS. 3A and 3C. The P-well diodes 302 lie directly in the P-well 306 and the deep N-well layer 303 lies underneath the P-well 306 to isolate it from the P-substrate 304. So, in this embodiment, the N-well 303 functions as a guard-band, thus forming an NPN transistor 305 between the diode cathode (N+ in diode 302), the isolated P-well 306 and the N-well 303.

Figure 3B:
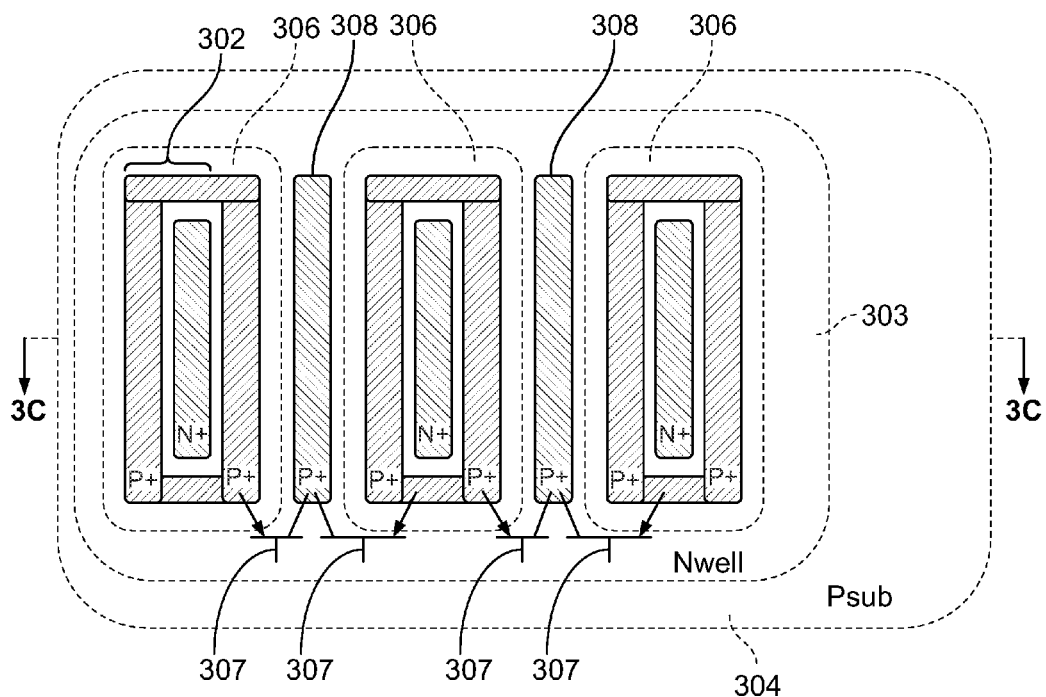
FIG. 3B illustrates a top view of an ESD device circuit in accordance with an alternate embodiment with reference to FIG. 3A of the present invention.
Figure 3C:
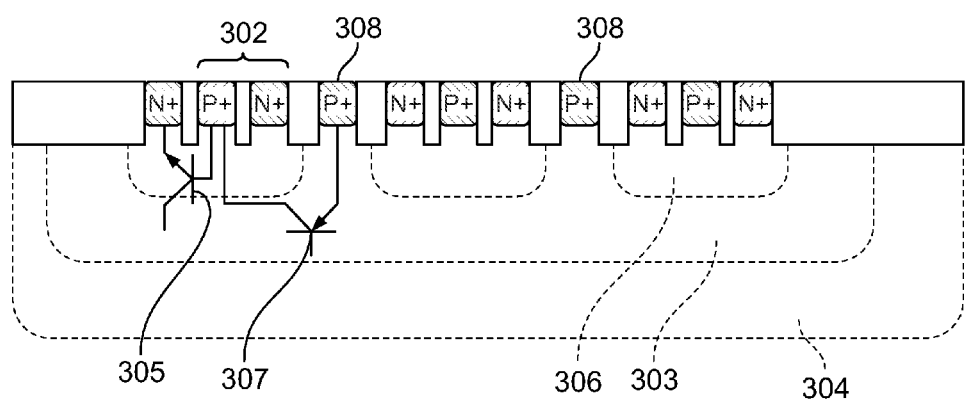
FIG. 3C illustrates a cross-section view of an ESD device circuit in accordance with an alternate embodiment of the present invention with reference to FIGS. 3A and 3B.

In an alternate embodiment, a P+ region 308 is added in the N-well 303 between the P-well diodes 302 of the device 300 of FIG. 3A as illustrated in FIG. 3B. FIG. 3B illustrates a top view of the device 300 of FIG. 3A with the added P region 308. By adding the P+ region 308 in the deep N-well 303 between the P-well diodes 302 would form a PNP transistor 307 as shown in FIGS. 3B and 3C. This PNP transistor 307 would add a PNP pumping effect to the already existing NPN 305 between the diodes 302, thus further strengthening the NPN 305. This behavior of the combination of the NPN and the PNP is the same as described above with respect to FIGS. 1A and 1B. Note that in this embodiment, the deep N-well 303 can be biased to any given potential. This is typically done by adding N+ in the deep N-well 303 to make contact between the power lines and the N-well 303. The N-well and deep N-well are placed around the diode to clearly isolate the P-well to the substrate. Generally, the N-well is mostly connected to a fixed voltage source, i.e. one of the power lines, however, the N-well can also be connected to other nodes or even remain floating.

Figure 4:
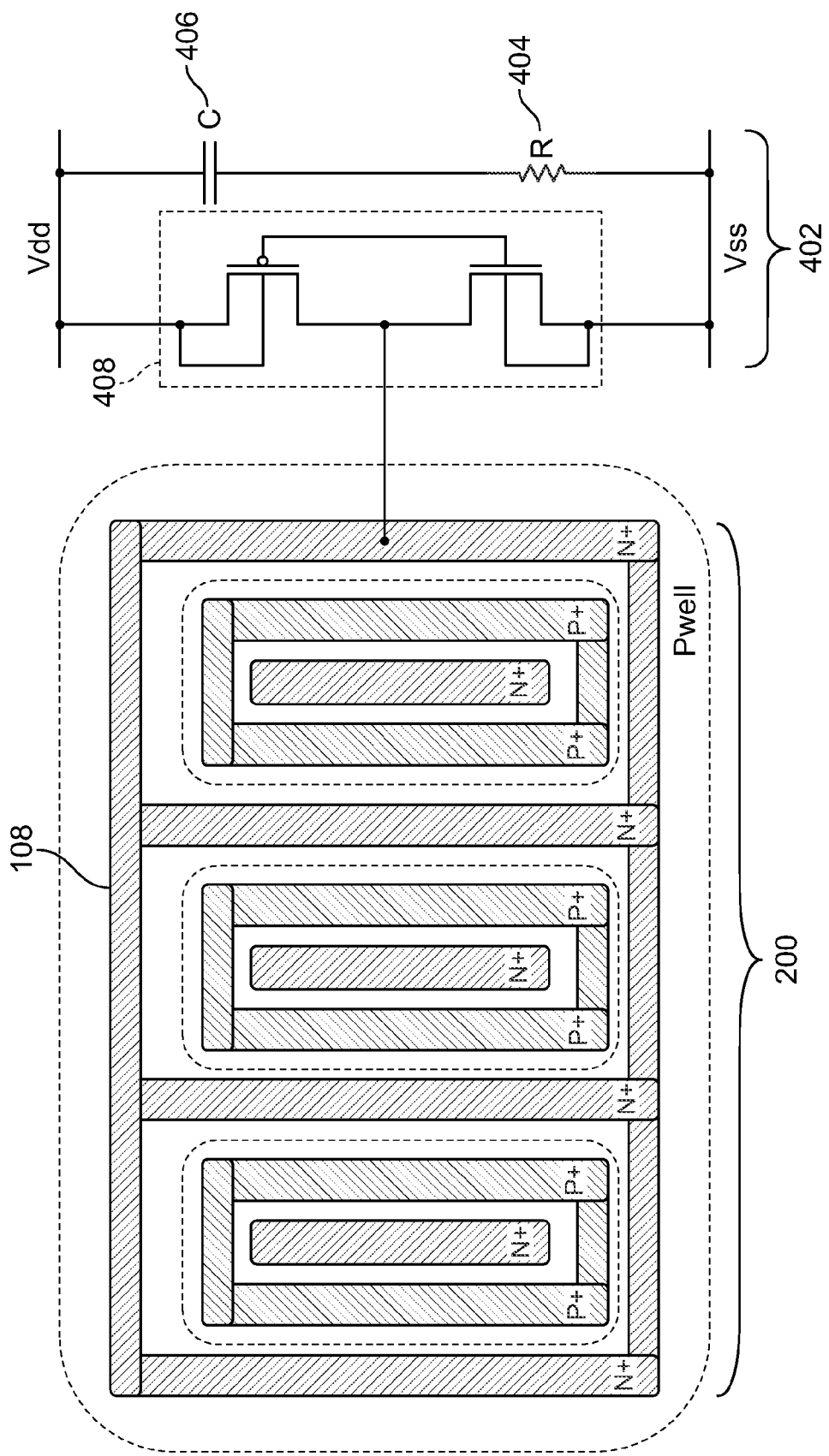
FIG. 4 illustrates a top view of the ESD device of FIG. 2 and a trigger circuit in accordance with yet another embodiment of the present invention.

FIG. 4 illustrates an ESD protection device 400 in accordance with yet another embodiment of the present invention. In this embodiment, the N+ guard-band 108 of the ESD device 200 is connected to a triggering circuit 402 as shown in FIG. 4. The triggering circuit 402 functions to speed up the diode chain as will be described in greater detail below.

In the example illustrated in FIG. 4, the trigger circuit 402 includes a resistor 404, a capacitor 406 and an inverter 408. The capacitor 404 of the circuit 402 will pull during ESD, causing the input of the inverter 408 to be high. The output of the inverter 408 will switch to low which in turn will produce a low potential to the N+ guard-band 108. This will help to turn on the PNP 103 (since PN junction is forward-biased) which in turn supplies current to turn on the NPN 105. During normal operation the capacitor 404 will pull the input of the inverter 408 to ground. The output of the inverter 208 will then turn to high. This will pull the N+ guard-band 108 to the high potential, keeping the PN junction 102 in reverse, which will turn off the PNP 103. This will prevent the NPN 105 from conducting any current (i.e. NPN remains turned off), which in turn prevents the PNP 103 from conducting any current during normal operation. Thus, the trigger circuit 402 uses the RC to bias the N+ guard-band 108 low during ESD and high during normal operation. During normal operation the NPN will create an extra leakage path, by pulling the emitter high during normal operation, the NPN is disabled, and will introduce less leakage during normal operation. With this circuit a clear difference can be made between normal operation and operation when ESD occurs. The triggering circuit 402 in this embodiment is the RC transient detector, however, one skilled in the art would appreciate that the triggering circuit can consist of other elements such as diodes, inductances, transistors etc., including a combination of these elements. The N+ guard-band 108 in the device 400 can also be shorted to ground or to any reference voltage in the IC.

Figure 5A:
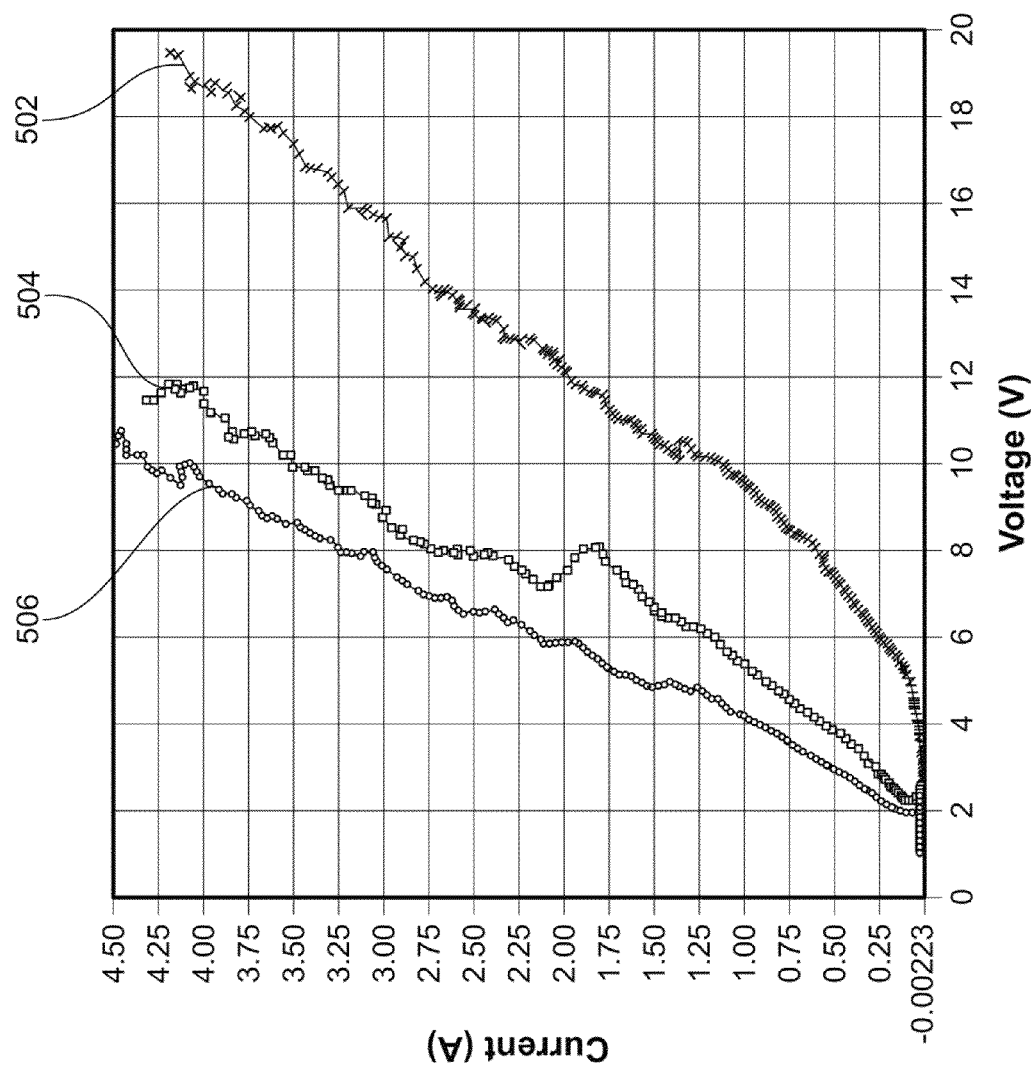
FIG. 5A illustrates an example measured data plot of a current and voltage curve of prior art and an embodiment of the present invention.

Referring to FIG. 5A, there is illustrated a graphical plot of data measurements of current (I) and voltage (V) of the ESD circuits of prior art and the present invention. The x-axis represents the voltage (V) and the y-axis represents the current (I). The data measurements are taken for a very short time period, preferably in the range of 2-3 nano-seconds. The data measurements illustrate a voltage curve 502 of the prior art ESD device with a P+ guard-band, a voltage curve 504 of the N+ guard-band 108 of the ESD device 200 of FIG. 2 and a voltage curve 506 of the N+ guard-band 108 of the ESD device 100 of FIG. 1. As illustrated in FIG. 5A, for the same amount of current, the voltages 504 and 506 of the N+ guard-band 108 of the ESD devices 200 and 100 respectively are much lower compared to the voltage 502 of the ESD device of the prior art with a P+ guard-band. In fact, the voltage 506 of the N+ guard-band 108 of the ESD device 200 is even lower than the voltage 504 of the N+ guard-band of the ESD device 100. As discussed above, this is due to the fact that the N+ guard-band 108 of FIG. 2 creates a larger perimeter/area around the diodes, thus providing for an even stronger NPN formed for each diode in the device.

Figure 5B:
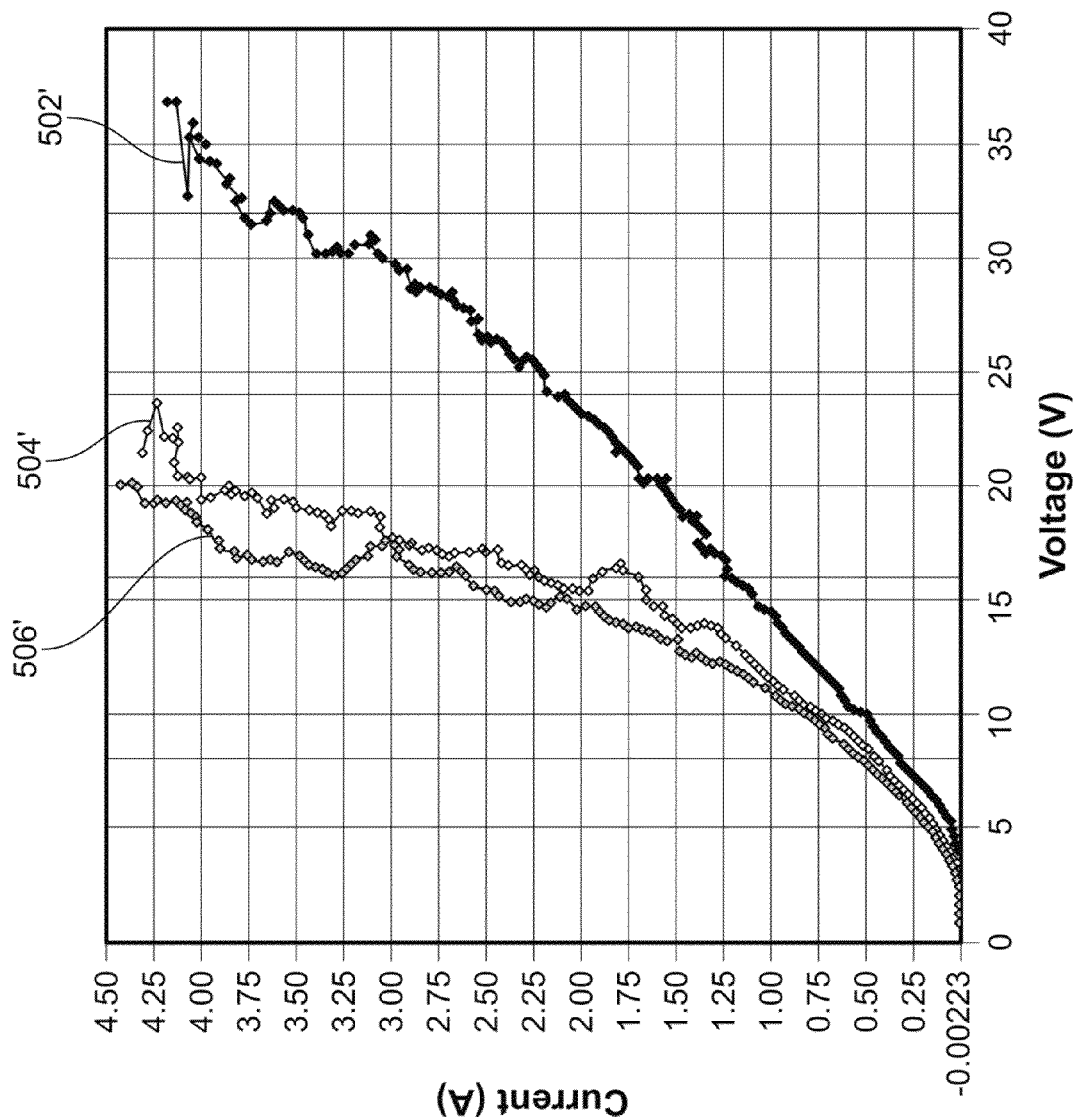
FIG. 5B illustrates an example measured data plot of an overshoot voltage and current of prior art and an embodiment of the present invention.

Referring to FIG. 5B, there is illustrated a graphical plot of data measurements of overshoot voltage (x-axis) vs. the current (y-axis) of the ESD circuits of the prior art and the present invention. The data measurements of the overshoot voltage (i.e. maximum voltage of the ESD device) are taken for an even shorter time period, preferably approximately 100 pico-seconds. The data measurements illustrate an overshoot voltage curve 502' of the prior art ESD device with a P+ guard-band, an overshoot voltage curve 504' of the N+ guard-band 108 of the ESD device 200 of FIG. 2 and an overshoot voltage curve 506' of the N+ guard-band 108 of the ESD device 100 of FIG. 1. As illustrated in FIG. 5B, for the same amount of current, the overshoot voltages 504' and 506' of the N+ guard-band 108 of the ESD devices 200 and 100 respectively are much lower compared to the overshoot voltage 502' of prior art ESD device with the P+ guard-band. In fact, the overshoot voltage 506' of the N+ guard-band 108 of the ED device is even lower than the overshoot voltage 504' of the N+ guard-band 108 of the ESD device 100. As discussed above, this is due to the fact that the N+ guard-band 108 of FIG. 2 creates a larger perimeter/area around the diodes, thus providing for an even stronger NPN formed for each diode in the device.

Thus, as described in the embodiments of the present invention above, an N+ guard-band around the diodes provides for a much reduced voltage including the overshoot voltage in the ESD protection devices, thus preventing damage to the circuitry during an ESD event. It is noted that similar results may be achieved by a Silicon Controlled Rectifier (SCR) in a larger time domain (after the settling time), however, an SCR would not function as fast and trigger as quickly as the NPN transistor formed by placing an N+ guard-band around the diodes as described above. Also, as discussed above, the present invention could be implemented using only one diode; however, the one diode may not go into an SCR mode. The voltages where these devices operate are below the minimum voltage that is needed to sustain the SCR in an SCR mode.

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An Electrostatic Discharge (ESD) protection device comprising:
   at least one diode in a first well of a first conductivity type formed directly in a second well of a second conductivity type; and
   a guard-band of the first conductivity type bordering at least a portion of the at least one diode, wherein the guard-band is formed completely within the second well.

2. The ESD protection device of claim 1 wherein the first conductivity type comprises an N-type doping region and the second conductivity type comprises a P-type doping region.

3. An Electrostatic Discharge (ESD) protection device comprising:
   at least one diode in a first well of a first conductivity type formed directly in a second well of a second conductivity type; and
   a guard-band of the first conductivity type bordering at least a portion of the at least one diode;
   wherein the first conductivity type comprises an N-type doping region and the second conductivity type comprises a P-type doping region;
   and wherein an NPN transistor is formed by the first well of the first conductivity type, the second well of the second conductivity type and the guard-band of the first conductivity type.

4. The ESD protection device of claim 3 wherein the guard-band is coupled to a low voltage, wherein the low voltage is less than a voltage of an anode of the at least one diode.

5. The ESD protection device of claim 4 wherein the guard-band is coupled to a cathode of the at least one diode.

6. The ESD protection device of claim 2 wherein a PNP transistor is formed by a PN junction of the at least one diode and the second well of the second conductivity type.

7. The ESD protection device of claim 1 wherein the first conductivity type comprises a P-type doping region and the second conductivity type comprises an N-type doping region.

8. An Electrostatic Discharge (ESD) protection device comprising:
   at least one diode in a first well of a first conductivity type formed directly in a second well of a second conductivity type; and
   a guard-band of the first conductivity type bordering at least a portion of the at least one diode;
   wherein the first conductivity type comprises a P-type doping region and the second conductivity type comprises an N-type doping region;
   and wherein a PNP transistor is formed by the first well of the first conductivity type, the second well of the second conductivity type, and the guard-band of the first conductivity type.

9. The ESD protection device of claim 7 wherein the guard-band is coupled to a high voltage, wherein the high voltage is higher than a voltage of a cathode of the at least one diode.

10. The ESD protection device of claim 9 wherein the guard-band is coupled to an anode of the at least one diode.

11. The ESD protection device of claim 1 wherein the guard-band is coupled to ground.

12. The ESD protection device of claim 1 wherein the guard-band is coupled to a power line.

13. The ESD protection device of claim 1 wherein the at least one diode comprises at least one of a Shallow Trench Isolation (STI) diode, a gated diode or a NO-STI diode.

14. The ESD protection device of claim 1 wherein the at least one diode comprises a PN junction diode.

15. The ESD device of claim 14 wherein an NPN transistor is formed by a PN junction of the at least one diode and the second well.

16. The ESD device of claim 2 further comprising a triggering circuit connected to the guard-band.

17. The ESD device of claim 16 wherein the triggering circuit connects the guard-band to a low potential during an ESD event.

18. The ESD device of claim 16 wherein the triggering circuit connects the guard-band to a high potential during normal operation.

19. The ESD device of claim 8 further comprising a triggering circuit connected to the guard-band.

20. The ESD device of claim 19 wherein the triggering circuit connects the guard-band to a high potential during an ESD event.

21. The ESD device of claim 19 wherein the triggering circuit connects the guard-band to a low potential during normal operation.

22. The ESD protection device of claim 2 wherein the guard-band comprises an N-well region.

23. The ESD protection device of claim 8 wherein the guard-band comprises a P-well region.

24. The ESD protection device of claim 1 wherein the guard-band completely surrounds the at least one diode.

25. The ESD protection device of claim 1 wherein a highly doped region of the second conductivity type is formed between at least a first diode and a second diode.

* * * * *